(12) United States Patent
Jeng (10) Patent No.: US 9,177,665 B1
(45) Date of Patent: Nov. 3, 2015

(54) WRITE AND READ CIRCUIT FOR ANTI-FUSE NON-VOLATILE MEMORY

(71) Applicant: Chung Yuan Christian University, Taoyuan (TW)

(72) Inventor: Syang-Ywan Jeng, Taipei (TW)

(73) Assignee: CHUNG YUAN CHRISTIAN UNIVERSITY (TW)

( * ) Notice: Subject to any disclaimer, the term of this patent is extended or adjusted under 35 U.S.C. 154(b) by 0 days.

(21) Appl. No.: 14/616,703

(22) Filed: Feb. 7, 2015

(51) Int. Cl.
  *G11C 17/00* (2006.01)
  *G11C 17/18* (2006.01)
  *G11C 17/16* (2006.01)

(52) U.S. Cl.
  CPC .............. *G11C 17/18* (2013.01); *G11C 17/16* (2013.01)

(58) Field of Classification Search
  CPC ........................................................ G11C 17/00
  USPC .............. 365/46, 94, 96, 100, 113, 129, 148,
    365/163; 274/2–5, 9, 296, 344, E31.047,
    274/E27.006; 438/29, 95, 96, 166, 259,
    438/365, 482, 486, 597
  See application file for complete search history.

(56) References Cited

U.S. PATENT DOCUMENTS

| | | | |
|---|---|---|---|
| 2007/0018245 A1* | 1/2007 | Jeng ................... | H01L 21/28282 257/344 |
| 2008/0049485 A1* | 2/2008 | Matsufuji ............... | G11C 17/18 365/96 |
| 2008/0165564 A1* | 7/2008 | Namekawa ............ | G11C 17/16 365/96 |
| 2009/0141535 A1* | 6/2009 | Yang ...................... | G11C 17/16 365/96 |
| 2009/0201713 A1* | 8/2009 | Shin ....................... | G11C 17/16 365/96 |
| 2010/0110750 A1* | 5/2010 | Namekawa ............ | G11C 5/145 365/96 |
| 2010/0182818 A1* | 7/2010 | Ito .......................... | G11C 17/18 365/96 |
| 2010/0309709 A1* | 12/2010 | Shin ....................... | G11C 17/16 365/96 |
| 2012/0314472 A1* | 12/2012 | Chung ................ | G11C 11/5678 365/96 |
| 2012/0314473 A1* | 12/2012 | Chung ................ | G11C 11/5678 365/96 |
| 2012/0320656 A1* | 12/2012 | Chung .................. | G11C 11/56 365/96 |
| 2012/0320657 A1* | 12/2012 | Chung .................. | G11C 11/56 365/96 |

* cited by examiner

Primary Examiner — Harry W Byrne (57) ABSTRACT

The present invention relates to a write and read circuit for an anti-fuse non-volatile memory, and especially for an OTP (one-time-program) NOI (Non-overlapped implementation) MOSFET memory device. The NOI MOSFET memory device can be written with a programming bit by using anti-fuse technique through the write circuit of the present invention. To accomplish the bit-programming process, the write circuit applies a high voltage to the Drain terminal of the NOI MOSFET memory device for carrying out a punch through breakdown between the Drain terminal and the Source terminal of the NOI MOSFET memory device, and then the programming bit is written into a side wall adjacent the gate terminal of the NOI MOSFET memory device. Therefore, the programming bit stored in the NOI MOSFET memory device can also be read out by using the read circuit of the present invention.

14 Claims, 6 Drawing Sheets

WRITE AND READ CIRCUIT FOR ANTI-FUSE NON-VOLATILE MEMORY

BACKGROUND OF THE INVENTION

1. Field of the Invention

The present invention relates to the technology field of non-volatile memory accessing circuits, and more particularly to a write and read circuit for anti-fuse non-volatile memories.

2. Description of the Prior Art

Recently, the role a non-volatile memory plays in semiconductor memory devices has become all the more important. Moreover, with the popularization of portable electronic products such as notebook, digital camera, smart phone, and tablet PC, the non-volatile memories are broadly applied and required to include higher unit-area storage capacity.

Figure 1:
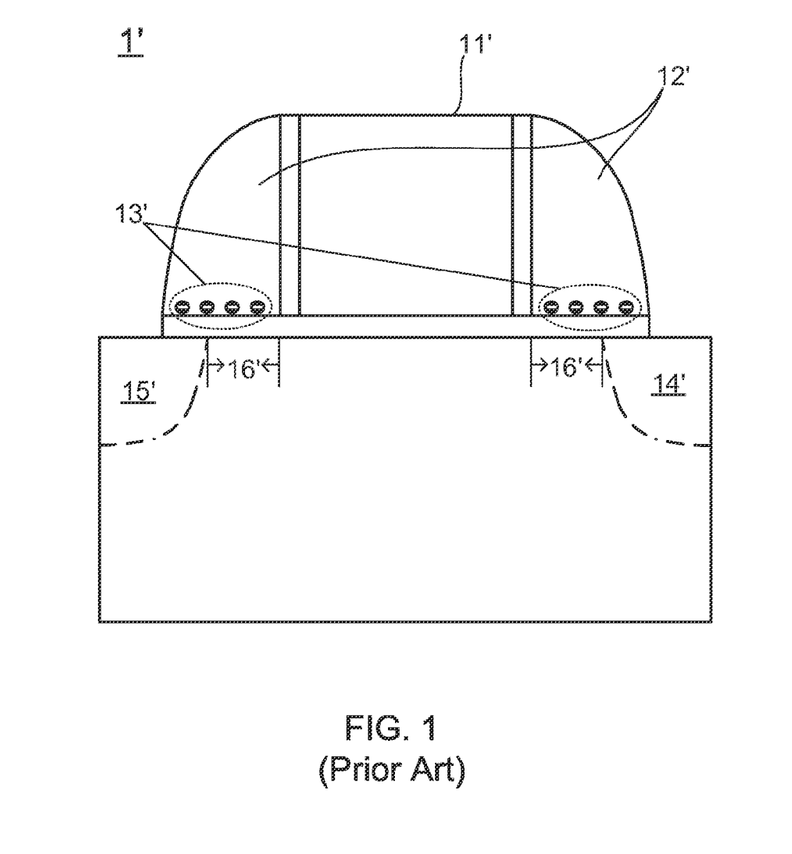
FIG. 1 is a cross-sectional structure view of a conventional NOI device.

NOI (Non-Overlapped Implementation) metal-oxide semiconductor field-effect transistor, including the cross-sectional structure shown by FIG. 1, is a navel non-volatile memory device. As shown in FIG. 1, by using CHEI (Channel Hot Electron Injection) way, the NOI device 1' can be written with the bits 13' in two spacers 12' formed on the two sides of the Gate terminal 11' thereof. For accomplishing the CHEI, it is able to apply a high voltage on the Gate terminal 11' and the Drain terminal 14' (or Source terminal 15') of the NOI device 1' for accelerating the speed of the electrons flowing out from the Source terminal 15' (or Drain terminal 14') in the channel under the Gate terminal 11' and two non-overlapped implementation regions under the spacers 12'. On the contrary, the bits 13' stored in the spacers 12' can also be erased (eliminated) by using HHI (Hot Hole Injection) way. In order to carry out the HHI, it needs to simultaneously apply a negative voltage and a high positive voltage on the Gate terminal 11' and the Drain terminal 14' (or the Source terminal 15') of the NOI device 1'.

Figure 2:
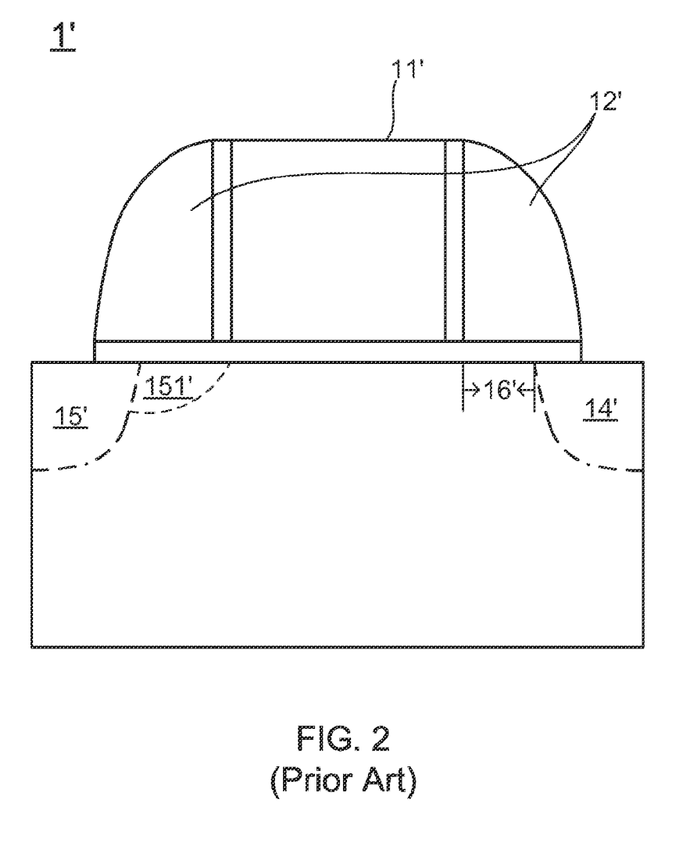
FIG. 2 is the cross-sectional structure view of the conventional NOI device.

According to researches, the NOI device 1' can not only be a multi-bits non-volatile device but also an OTP (one-time program) non-volatile device. As the cross-sectional structure of the NOI device 1' shown by FIG. 2, it can form a LDD (Lightly Doped Drain) region 151' adjacent to the junction of the Source 15' of the NOI device 1'. Therefore, a forward read threshold voltage (Vth) and a reverse read threshold voltage can be obtained after treating a forward read and a reverse read to the NOI device 1', respectively. Moreover, the absolute value of the voltage difference between the forward read threshold voltage and the reverse read threshold voltage may be greater than 0.5V, and such result implies that the NOI device 1' has been written with one bit after the LDD region 151' is formed adjacent to the junction of the Source 15'. However, the formed LDD region 151' cannot be removed from the NOI device 1' anymore.

Figure 3:
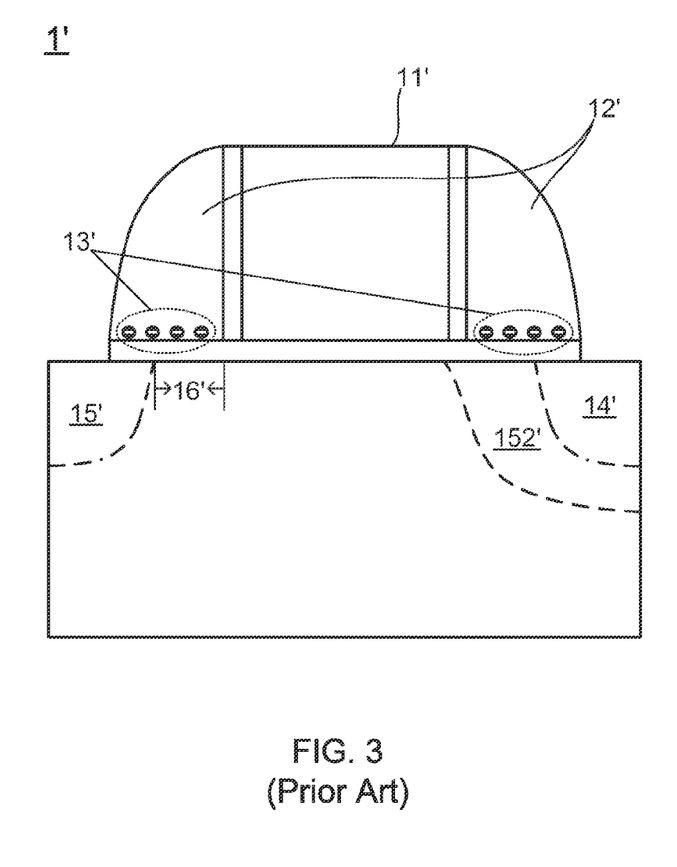
FIG. 3 is the cross-sectional structure view of the conventional NOI device.

Besides aforesaid LDD-forming technique for facilitating the NOI device 1' be written with one bit, there still has another way for making the NOI device 1' become an OTP memory device, wherein the another way is called anti-fuse programming. As the cross-sectional structure shown by FIG. 3, a punch through breakdown (PTB) between the Source 15' and the Drain 14' is achieved after applying a high voltage of 7.5V~8.0V to the Drain terminal 14' of the NOI device 1' for forming an SDE (Source Drain Extension) region 152' extended from the Drain 14' to the Source 15'. Thus, the value of the current read from the NOI device 1' having the SDE region 152' may reach 1 mA, and then such NOI device 1' can be defined to the memory device been programmed (written). On the contrary, if the NOI device 1' does not be programmed through the PTB way, the current read from the NOI device 1' can be as low as 1 pA; meanwhile, the NOI device 1' is defined to the memory device without being programmed (written). Similar to aforesaid LDD formation, the established PTB cannot be eliminated from the NOI device 1' anymore.

Although researches has been found the NOI device 1' can be selectively used as a multi-bits memory device or an OTP memory device, a specific bit-writing circuit and/or a specific bit-reading circuit for accessing the NOI devices 1' does still not be proposed. Accordingly, the inventor of the present application has made great efforts to make inventive research thereon and eventually provided a write and read circuit for anti-fuse non-volatile memory.

SUMMARY OF THE INVENTION

The primary objective of the present invention is to provide a write and read circuit for anti-fuse non-volatile memory, wherein the write and read circuit is particularly designed in the present invention and used for accessing any type of OTP (one-time-program) non-volatile memories using NOI (Non-overlapped implementation) MOSFET device as its primary structure, such as writing bits into the OTP NOI memory devices or reading bits out from the OTP NOI memory devices.

Accordingly, to achieve the primary objective of the present invention, the inventor of the present invention provides a write and read circuit for anti-fuse non-volatile memory used for treating a bit-writing operation and/or a bit-reading operation to a NOI (non-overlapped implementation) MOSFET device, wherein the NOI MOSFET device at least has a NOI gate side, a NOI drain side and a NOI source side, and the write and read circuit comprises:

a bit-writing unit, coupled to the NOI drain side for writing at least one memory bit into the NOI MOSFET device;

a bit-reading unit, coupled to the NOI drain side for reading the memory bit out from the NOI MOSFET device, so as to output a bit signal;

a charging unit, coupled to the NOI drain side, the bit-writing unit, the bit-reading unit, and a first bias voltage, wherein the charging unit couples the first bias voltage to the NOI drain side according to the control of a read/write command signal inputted by an external terminal;

a discharge unit, coupled to the NOI source side of the NOI MOSFET device; and a control unit, coupled to the discharge unit and receiving the read/write command signal and the bit signal, so as to output a control signal to the discharge unit for making the NOI MOSFET device discharge via the discharge unit.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a write and read circuit for anti-fuse non-volatile memory according to the present invention, embodiments of the present invention will be described in detail with reference to the attached drawings hereinafter.

Figure 4:
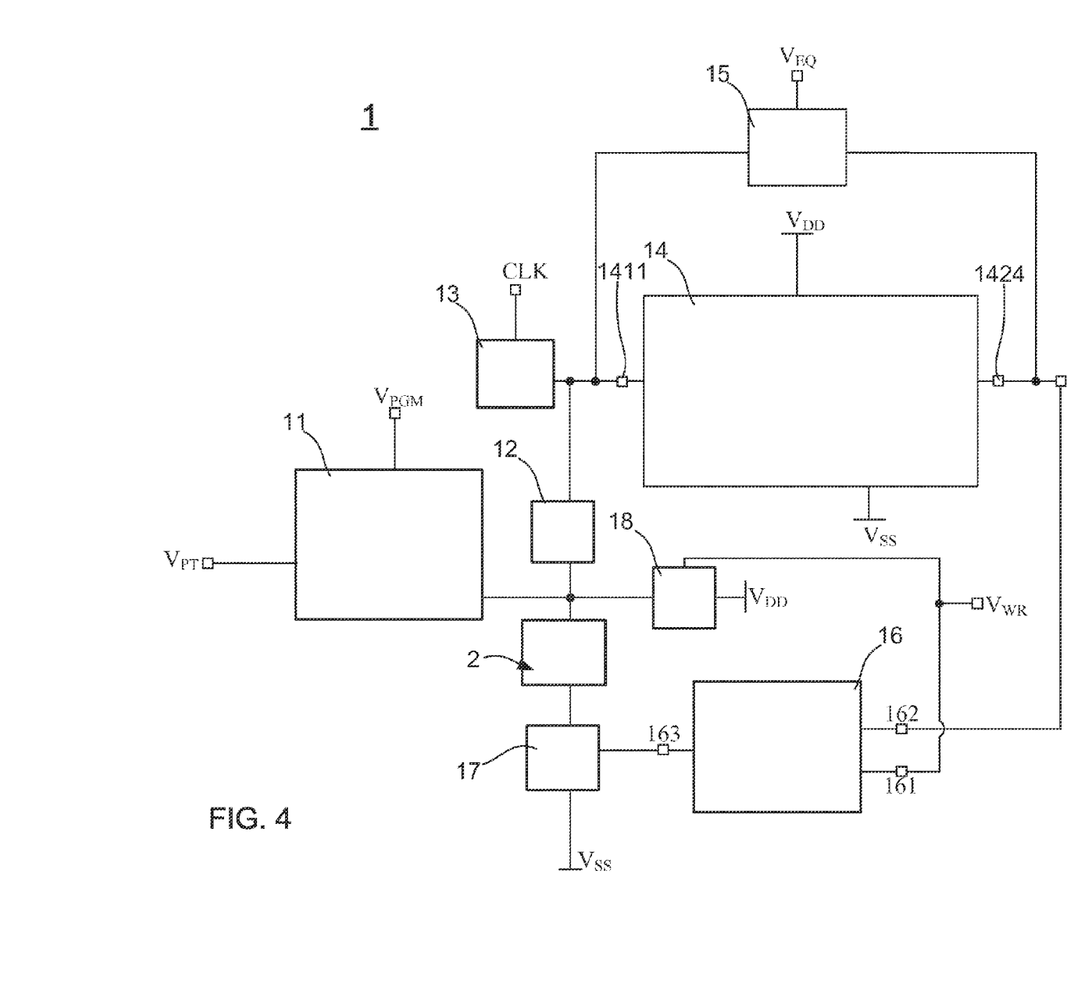
FIG. 4 is a circuit block diagram of a write and read circuit for anti-fuse non-volatile memory according to the present invention.

With reference to FIG. 4, which illustrate a circuit block diagram of a write and read circuit for anti-fuse non-volatile memory according to the present invention. As shown in FIG. 4, the write and read circuit 1 of the present invention is used for treating a bit-writing operation and/or a bit-reading operation to a NOI (non-overlapped implementation) MOSFET device, wherein the NOI MOSFET device 2 at least has a NOI gate side 20, a NOI drain side 21 and a NOI source side 22. The write and read circuit 1 consists of: a bit-writing unit 11, a bit-reading unit 12, an anti-interference unit 13, a bit-latching unit 14, a voltage-equalization member 15, a control unit 16, a discharge unit 17, and a charging unit 18.

Figure 5:
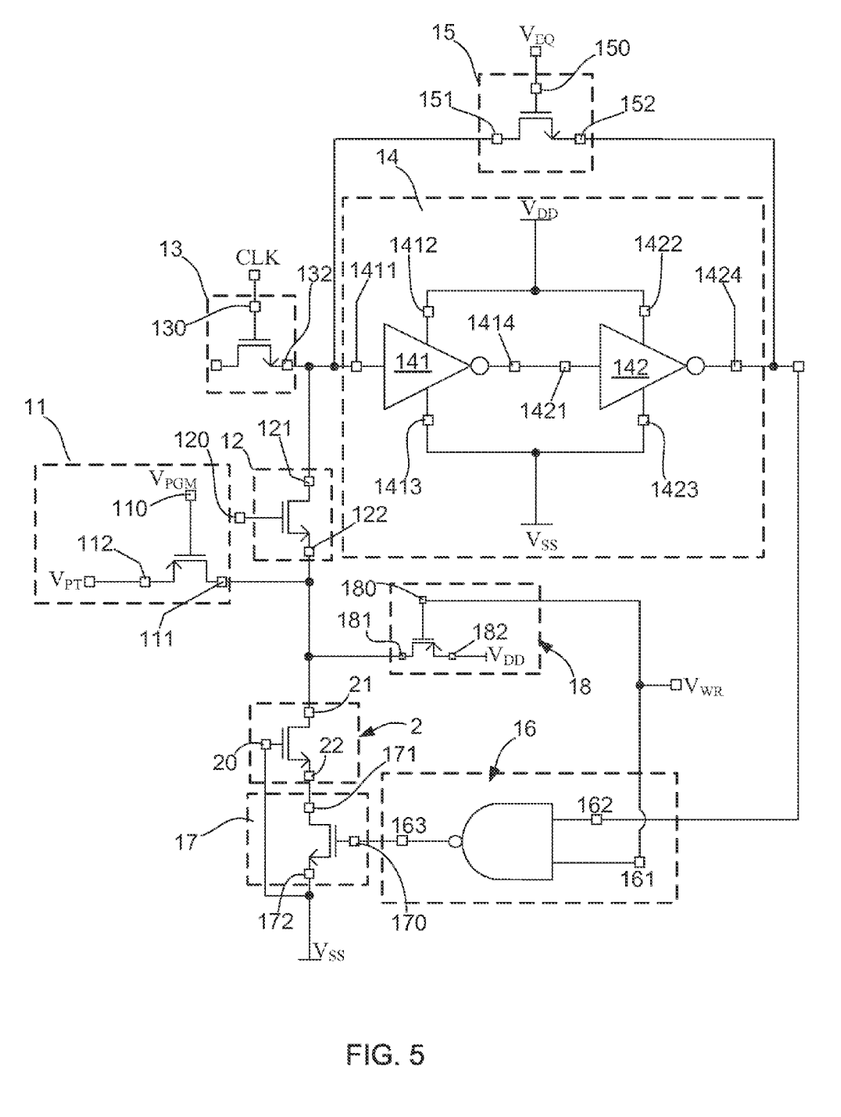
FIG. 5 is a circuit framework view of the write and read circuit for anti-fuse non-volatile memory according to the present invention.

Continuously referring to FIG. 4, and please simultaneously refer to FIG. 5, which show a circuit framework view of the write and read circuit 1. As shown in FIG. 4 and FIG. 5, the bit-writing unit 11 is a P-type MOSFET (metal-oxide semiconductor field-effect transistor), and the P-type MOSFET is respectively coupled to the NOI drain side 21, a first programming voltage $V_{PGM}$ and a second programming voltage $V_{PT}$ by a drain end 111, a gate end 110 and a source end 112 thereof. In the present invention, the bit-writing unit 11 is used for providing a high voltage to the NOI drain side 21 and carrying out a Punch Through Breakdown (PTB) between the NOI drain side 21 and the NOI source side 22, so as to write at least one memory bit into the NOI MOSFET device 2 by using such anti-fuse technique.

However, if the NOI MOSFET device 2 has already formed with at least one LDD (Lightly Doped Drain) region adjacent to the junction of the source 22 (or the drain 21) thereof, that means the NOI MOSFET device 2 has been written with at least one bit, and does not need to write any bits into the NOI MOSFET device 2 by using the anti-fuse technique.

The bit-reading unit 12 is also a N-type MOSFET, which is coupled to the NOI drain side 21 by a source terminal 122 thereof; in addition, a gate terminal 120 of the N-type MOSFET being used as an output end of the bit-reading unit 12. It can easily know that the bit-reading unit 12 in the write and read circuit 1 is configured for reading the memory bit out from the NOI MOSFET device 2, and then outputting a bit signal. Moreover, the charging unit 18 is coupled to the NOI drain side 21, the bit-writing unit 11, the bit-reading unit 12, and a first bias voltage $V_{DD}$, wherein the charging unit 18 is used for coupling the first bias voltage to the NOI drain side 21 according to the control of a read/write command signal $V_{WR}$ inputted by an external terminal. As shown in FIG. 5, the charging unit 18 is a P-type MOSFET coupling to the first bias voltage $V_{DD}$ by a drain end 182 thereof; moreover, a source end 182 of the P-type MOSFET is coupled to the NOI drain side 21, the bit-writing unit 11 and the bit-reading unit 12, and a gate end 180 of the P-type MOSFET being coupled to the read/write command signal $V_{WR}$. Besides, the control unit 16 is coupled to the discharge unit 17, and the discharge unit 17 is further coupled to the NOI source side 22 for facilitating the control unit 16 be able to receive the read/write command signal $V_{WR}$ and the bit signal, so as to output a control signal to the discharge unit 17 for making the NOI MOSFET device 2 discharge via the discharge unit 17.

Figure 6:
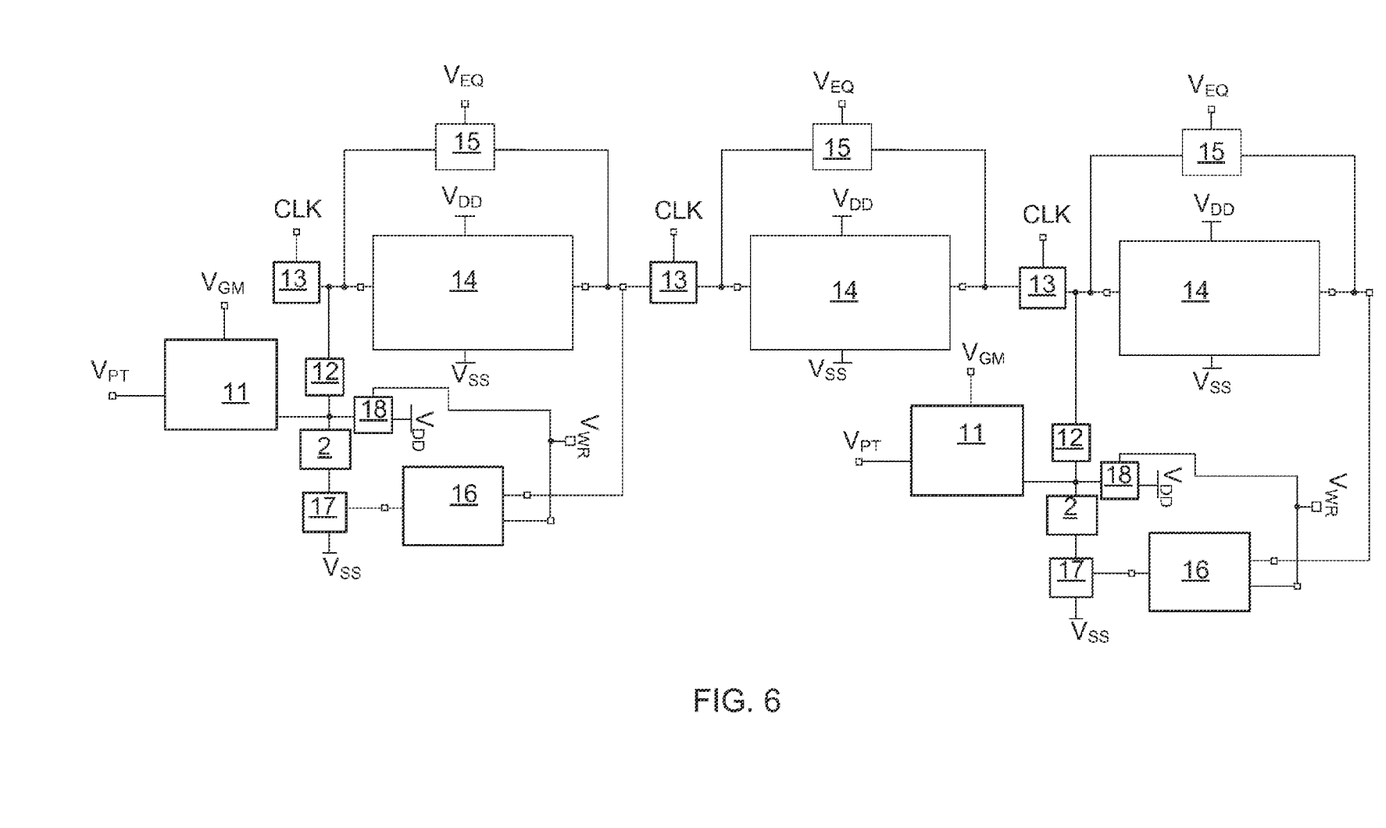
FIG. 6 is a circuit block diagram of two write and read circuits connected to each other.

Inheriting to above descriptions, the discharging unit 17 is also a N-type MOSFET respectively coupling to a logic output terminal 163 of the control unit 16 and the NOI source side 22 by a gate terminal 170 and a drain terminal 171 thereof, and a source terminal 172 of the N-type MOSFET is coupled to the NOI gate side 20 and a second bias voltage $V_{SS}$. Moreover, the control unit 16 in the write and read circuit 1 is an NAND logic gate having two logic input terminals (161, 162) for respectively coupling to the read/write command signal $V_{RW}$ and the bit signal; moreover, the control unit 16 further has one logic output terminal 163 coupling to the gate terminal 170 of the discharging unit 17. As shown in FIG. 6, the first bias voltage $V_{DD}$ is a positive voltage, and the second bias $V_{SS}$ is a negative voltage or grounded opposite to the first bias voltage.

As shown in FIG. 5, particularly, a an anti-interference unit 13 is coupled to the bit-reading unit 12 and a periodic clock signal, wherein the anti-interference unit 13 is used for protecting the bit signal from interference when the bit-reading unit 12 reads out the memory bit and outputs the bit signal. Moreover, as shown in FIG. 6, the anti-interference unit 13 is a first N-type MOSFET respectively coupling to the drain terminal 121 of the bit-reading unit 12 and the periodic clock signal by a source terminal 132 and a gate terminal 130 thereof. Furthermore, in the write and read circuit 1 proposed by the present invention, the bit-latching unit 14 is coupled to the anti-interference unit 13 and the bit-reading unit 12 for receiving the bit signal, so as to treat the bit signal with a bit-latching operation.

Inheriting to above descriptions, the bit-latching unit 14 consists a first inverter 141 and a second inverter 142. The first inverter 141 is coupled to the anti-interference unit 13, the bit-reading unit 12 and a voltage-equalization member 15 by a first inverter input terminal 1411 thereof; in addition, the first inverter 141 further has a first DC terminal 1412 coupling to the first bias voltage $V_{DD}$ and a second DC terminal 1413 coupling to the second bias voltage $V_{SS}$, wherein the first inverter input terminal 1411 is used as a bit signal inputting terminal for receiving the bit signal. Moreover, the second inverter 142 is coupled to a first inverter output terminal 1414 of the first inverter 141 by a second inverter input terminal 1421 thereof; besides, the second inverter 142 further has a third DC terminal 1422 coupling to the first bias voltage $V_{DD}$ and a fourth DC terminal 1423 coupling to the second bias voltage $V_{SS}$, wherein a second inverter output terminal 1424 of the second inverter 142 is used as a bit signal outputting terminal coupling to the voltage-equalization member 15 and the control unit 16 for outputting the bit signal. As shown in FIG. 6, the voltage-equalization member 15 is also a second N-type MOSFET respectively coupling to the bit signal inputting terminal and the bit signal outputting terminal by a drain terminal 151 and a source terminal 152 thereof; moreover, a second gate terminal 150 of the voltage-equalization member 15 is coupled to an equalization voltage $V_{EQ}$. In the write and read circuit 1, the voltage-equalization unit 15 is configured for treat an equalization operation to the voltage of the bit signal inputting terminal and the voltage of the bit signal outputting terminal.

Herein, it needs to further explain that, although FIG. 4 and FIG. 5 merely show the NOI MOSFET device 1 is accessed by one single write and read circuit 1, that does not used for limiting the application of the NOI MOSFET device 1. As the circuit block diagram shown by FIG. 6, in other possible applications, several the write and read circuits 1 can be used for simultaneously accomplishing the bit-writing operation and the bit-reading operation of several the several the NOI MOSFET devices 2; moreover, one buffer unit consisted of the bit-latching unit 14 and the voltage-equalization unit 15 is provided between any two adjacent write and read circuits 1.

Therefore, through above descriptions, the circuit frameworks and related technology features of the write and read circuit 1 for anti-fuse non-volatile memory proposed by the present invention have been introduced completely and clearly; in summary, the present invention includes the advantages of:

(1) Because there are still no bit-writing circuits and/or bit-reading circuits for accessing the NOI MOSFET device 1, the present invention provides a write and read circuit 1 for anti-fuse non-volatile memory used for treating a bit-writing operation and/or a bit-reading operation to a NOI MOSFET device 2.

(2) Through the write and read circuit 1 provided by the present invention, users are able to write at least one bit into the NOI MOSFET device 2 by using anti-fuse technique after applying a high voltage to the NOI drain side 21 of the NOI MOSFET device 2 and carrying out a Punch Through Breakdown (PTB) between the NOI drain side 21 and the NOI source side 22 of the NOI MOSFET device 2.

(3) Inhering to above point 2, on the contrary, if the NOI MOSFET device 2 has already formed with at least one LDD (Lightly Doped Drain) region adjacent to the junction of the source 22 (or the drain 21) thereof, that means the NOI MOSFET device 2 has been written with at least one bit, and does not need to write any bits into the NOI MOSFET device 2 by using the anti-fuse technique.

The above description is made on embodiments of the present invention. However, the embodiments are not intended to limit scope of the present invention, and all equivalent implementations or alterations within the spirit of the present invention still fall within the scope of the present invention.

What is claimed is:

1. A write and read circuit for anti-fuse non-volatile memory used for treating a bit-writing operation and/or a bit-reading operation to a NOI (non-overlapped implementation) MOSFET device, wherein the NOI MOSFET device at least has a NOI gate side, a NOI drain side and a NOI source side, and the write and read circuit comprising:
  a bit-writing unit, being coupled to the NOI drain side for writing at least one memory bit into the NOI MOSFET device;
  a bit-reading unit, being coupled to the NOI drain side for reading the memory bit out from the NOI MOSFET device, so as to output a bit signal;
  a charging unit, being coupled to the NOI drain side, the bit-writing unit, the bit-reading unit, and a first bias voltage, wherein the charging unit couples the first bias voltage to the NOI drain side according to the control of a read/write command signal inputted by an external terminal;
  a discharge unit, being coupled to the NOI source side of the NOI MOSFET device; and
  a control unit, being coupled to the discharge unit and receiving the read/write command signal and the bit signal, so as to output a control signal to the discharge unit for making the NOI MOSFET device discharge via the discharge unit.

2. The write and read circuit for anti-fuse non-volatile memory of claim 1, wherein the bit-writing unit is a P-type MOSFET (metal-oxide semiconductor field-effect transistor), and the P-type MOSFET being respectively coupled to the NOI drain side, a first programming voltage $V_{PGM}$ and a second programming voltage by a drain end, a gate end and a source end thereof.

3. The write and read circuit for anti-fuse non-volatile memory of claim 1, wherein the bit-reading unit is a N-type MOSFET (metal-oxide semiconductor field-effect transistor) coupling to the NOI drain side by a source terminal thereof, and a gate terminal of the N-type MOSFET being used as an output end of the bit-reading unit.

4. The write and read circuit for anti-fuse non-volatile memory of claim 1, wherein the charging unit is a P-type MOSFET (metal-oxide semiconductor field-effect transistor), and the P-type MOSFET being coupled to the first bias voltage by a drain end thereof; moreover, a source end of the P-type MOSFET being coupled to the NOI drain side, the bit-writing unit and the bit-reading unit, and a gate end of the P-type MOSFET being coupled to the read/write command signal.

5. The write and read circuit for anti-fuse non-volatile memory of claim 1, wherein the control unit is an NAND logic gate having two logic input terminals for respectively coupling to the read/write command signal and the bit signal, moreover the control unit further has one logic output terminal coupling to the discharging unit.

6. The write and read circuit for anti-fuse non-volatile memory of claim 1, further comprising an anti-interference unit, being coupled to the bit-reading unit and a periodic clock signal; wherein the anti-interference unit is used for protecting the bit signal from interference when the bit-reading unit reads out the memory bit and outputs the bit signal.

7. The write and read circuit for anti-fuse non-volatile memory of claim 5, wherein the discharging unit is a N-type MOSFET (metal-oxide semiconductor field-effect transistor) respectively coupling to the logic output terminal and the NOI source side by a gate terminal and a drain terminal thereof, and a source terminal of the N-type MOSFET being coupled to the NOI gate side and a second bias voltage.

8. The write and read circuit for anti-fuse non-volatile memory of claim 6, wherein the anti-interference unit is a first N-type MOSFET (metal-oxide semiconductor field-effect transistor) respectively coupling to the bit-reading unit and the periodic clock signal by a first source terminal and a first gate terminal thereof.

9. The write and read circuit for anti-fuse non-volatile memory of claim 6, wherein the first bias voltage is a positive voltage, and the second bias is a negative voltage or grounded opposite to the first bias voltage.

10. The write and read circuit for anti-fuse non-volatile memory of claim 8, further comprising a bit-latching unit, being coupled to the anti-interference unit and the bit-reading unit for receiving the bit signal, so as to treat the bit signal with a bit-latching operation.

11. The write and read circuit for anti-fuse non-volatile memory of claim 10, wherein the bit-latching unit comprises:
  a first inverter, being coupled to the anti-interference unit, the bit-reading unit and a voltage-equalization member by a first inverter input terminal thereof, and the first inverter further having a first DC terminal coupling to the first bias voltage and a second DC terminal coupling to the second bias voltage; wherein the first inverter input terminal is used as a bit signal inputting terminal for receiving the bit signal; and
  a second inverter, being coupled to a first inverter output terminal of the first inverter by a second inverter input terminal thereof, and the second inverter further having a third DC terminal coupling to the first bias voltage and a fourth DC terminal coupling to the second bias voltage; wherein a second inverter output terminal of the second inverter is used as a bit signal outputting terminal coupling to the voltage-equalization member and the control unit for outputting the bit signal.

12. The write and read circuit for anti-fuse non-volatile memory of claim 11, wherein the voltage-equalization member is a second N-type MOSFET (metal-oxide semiconductor field-effect transistor) respectively coupling to the bit signal inputting terminal and the bit signal outputting terminal and an equalization voltage by a second source terminal, a second drain terminal and a second gate terminal thereof.

13. The write and read circuit for anti-fuse non-volatile memory of claim 11, wherein several the write and read circuits can be used for simultaneously accomplishing the bit-writing operation and the bit-reading operation of several the several the NOI MOSFET devices; moreover, one buffer unit being provided between any two adjacent write and read circuits.

14. The write and read circuit for anti-fuse non-volatile memory of claim 13, wherein the buffer unit is consisted of the bit-latching unit and the voltage-equalization unit.

* * * * *